United States Patent [19]
Ajit

[11] Patent Number: 5,793,066
[45] Date of Patent: Aug. 11, 1998

[54] BASE RESISTANCE CONTROLLED THYRISTOR STRUCTURE WITH HIGH-DENSITY LAYOUT FOR INCREASED CURRENT CAPACITY

[75] Inventor: Janardhanan S. Ajit, Redondo Beach, Calif.

[73] Assignee: International Rectifier Corporation, El Segundo, Calif.

[21] Appl. No.: 533,768

[22] Filed: Sep. 26, 1995

[51] Int. Cl.$^6$ ........................ H01L 29/74; H01L 31/111
[52] U.S. Cl. ........................ 257/152; 257/162; 257/165
[58] Field of Search .................... 257/147, 151, 257/152, 153, 162, 163, 164, 165

[56] References Cited

U.S. PATENT DOCUMENTS

| | | | |
|---|---|---|---|
| 4,258,377 | 3/1981 | Miyata et al. | 257/162 |
| 4,954,869 | 9/1990 | Bauer | 257/163 |
| 5,281,833 | 3/1992 | Ueno | 257/147 |

FOREIGN PATENT DOCUMENTS

| | | | |
|---|---|---|---|
| 6-204463 | 7/1994 | Japan | 257/147 |
| 2292009 | 2/1996 | United Kingdom | |

*Primary Examiner*—Wael Fahmy
*Attorney, Agent, or Firm*—Ostrolenk, Faber, Gerb & Soffen, LLP

[57] ABSTRACT

An insulated gate base resistance controlled thyristor with a high controllable current capability is described. The device has a high density of MOS-channels modulating the resistance of the base region of the NPN transistor of the thyristor structure. The higher MOS channel density is achieved by contacting directly only the $N^{++}$ emitter and the $P^+$ cells (and not the P base region of the NPN transistor) to the cathode electrode. The $N^{++}$ cells (i.e. the P base regions each containing an $N^{++}$ emitter) and the $P^+$ cells are connected in certain regions under the MOS gate by a $P^-$ region to provide a higher base resistance when a positive bias is applied to the MOS gate, thereby facilitating latching of the thyristor. The added MOS gate controlled base resistance between cells allows the P base cells to be designed with smaller dimensions for high maximum controllable current without affecting latch-up capability. The device is preferably provided in a checkerboard style cellular layout.

14 Claims, 18 Drawing Sheets

BASE RESISTANCE CONTROLLED THYRISTOR STRUCTURE WITH HIGH-DENSITY LAYOUT FOR INCREASED CURRENT CAPACITY

BACKGROUND OF THE INVENTION

1. Field of the Invention

The present invention relates to insulated gate thyristors and, more specifically, to a base resistance controlled insulated gate thyristor with a high-density layout for increased current capacity.

2. Description of the Related Art

Insulated gate thyristors are of great interest for high voltage power switching applications. In general, the principle of operation of insulated gate thyristors consists of allowing the on-state current to flow via a thyristor region, which can be switched-off by a signal applied to the gate of a MOS structure that is integrated into the thyristor structure. This concept has the advantages of low forward drop and ease of control. Examples of device structures that achieve this function are the MOS controlled thyristor ("MCT"), as described in V. A. K. Temple, "MOS-Controlled Thyristors (MCTs)", *IEEE Electron Device Meeting (IEDM) Technical Digest*, pp. 282–285, San Francisco, December 1984, and the base resistance controlled thyristor ("BRT"), as described in M. Nandakumar et al., "The Base Resistance Controlled Thyristor (BRT): A New MOS Gated Power Thyristor", *Proceedings of the ISPSD*, pp. 138–141, 1991 and in U.S. Pat. No. 5,381,023.

In both the MCT and BRT, a p-channel MOSFET is used to divert the thyristor current to a grounded $P^+$ region to turn-off the thyristor. MCTs have triple-diffused structures with the turn-off p-channel MOSFET integrated into the N emitter region which make such devices difficult to fabricate. BRTs have double-diffused structures, with the turn-off p-channel MOSFET integrated into the $N^-$ base region.

The maximum controllable current in MCT and BRT devices is primarily determined by the resistance of the turn-off MOSFET channel. To achieve high maximum controllable current density, it is desirable to increase the turn-off p-channel density. This can be achieved by reducing the fraction of $N^+$ emitter area in relation to the total cell area. In the prior art BRT, the latching current density ($J_{latch}$) depends on the length of the $N^+$ emitter ($L_{N++}$) given by $$J_{latch} = \frac{2 \times V_{be}}{\alpha_{pnp} P_{sh,pbase} L_{N++}^2}$$

For the thyristor structure to latch, the latching current density should be lower than the base drive for the NPN transistor which can be supplied by the structure. The charge in the P base and hence the sheet resistance of the P base ($P_{sh,pbase}$) is determined by breakdown voltage considerations, and sheet resistance cannot be increased beyond a certain value. Hence, to have a low latching current density, the length of the emitter has to be increased. This increases the fraction of $N^+$ emitter area and reduces the fraction of MOS channel density in relation to the total cell area, thereby reducing the maximum controllable current. Thus a low latching current in the BRT structure is achieved only by sacrificing the maximum controllable current possible. This imposes a limit on the maximum controllable current achievable with the BRT structure.

Accordingly, it would be desirable to provide a device which: 1) has high maximum controllable current density; 2) has low latching current; and 3) is easy to fabricate with good process control.

SUMMARY OF THE INVENTION

The present invention achieves the foregoing objective by providing an insulated gate thyristor, specifically a modification of the BRT, with a layout which facilitates a high density of MOS-channels resulting in high controllable current capability.

More specifically, the present invention is formed of a silicon chip having a plurality of spaced $N^{++}$ cells and spaced $P^+$ cells interspersed in checkerboard fashion over the surface area of the chip, whereby each of the $N^{++}$ cells is surrounded by ones of the $P^+$ cells. A respective $P^-$ diffusion extends between and connects adjacent $N^{++}$ cells and $P^+$ cells.

The $N^{++}$ cells each includes a $N^{++}$ emitter region spaced from an edge of a P-type cellular base region to form a respective channel. A polysilicon gate is disposed atop the channels of the $N^{++}$ cells, and atop the space between adjacent $N^{++}$ cells and $P^+$ cells.

A cathode contact is connected to the $P^+$ regions and the $N^{++}$ emitter regions (but not to the P base regions). A anode contact is connected to the bottom $P^{++}$ layer. The P base region is connected to the cathode contact only through the high resistance $P^-$ diffusion. This makes it possible to obtain a low latching current density without increasing the length of $N^{++}$ emitter. The latching current in this structure is given by $$J_{latch} = \frac{V_{be}}{\alpha_{pnp} L_{N+} Z_{N+} P_{sh,p} \frac{L_{p-}}{Z_{p-}}}$$

Thus, it is possible to obtain a low latching current and a high maximum controllable current at the same time for this structure.

Alternatively, in a lateral conduction embodiment of the invention, the cathode contact is connected to a first group of adjacent ones of $P^+$ regions and $N^{++}$ emitter regions, and the anode contact is connected to a second group of adjacent ones of $P^+$ regions and $N^{++}$ emitter regions, the anode contact being disposed atop the chip in lateral relation to the cathode contact, the first and second groups of adjacent $P^+$ regions and $N^{++}$ emitter regions each having separate respective gates, the gate of the first group of adjacent $P^+$ regions and $N^{++}$ emitter regions being operated in antiphase relation with the gate of the second group of adjacent $P^+$ regions and $N^{++}$ emitter regions.

Preferably, to prevent current crowding during turn-off, a plurality of adjacent $P^+$ cells are disposed at the outer periphery of the chip.

The present invention, by way of the above structure, achieves a higher MOS channel density since, unlike the prior art BRT, the P base region of the device of the present invention is connected to the cathode electrode only through a $P^-$ region whose resistance is modulated by the MOS gate voltage. The $P^-$ region connecting the $N^{++}$ cells and the $P^+$ cells provides a higher base resistance when a positive bias is applied to the gate, thereby facilitating latching of the thyristor. The $P^-$ region provides a low resistance turn-off current path when a negative bias is applied to the gate. The added MOS-gate-controlled base resistance between cells allows the $N^{++}$ cells to be designed with smaller dimensions without affecting latch-up capability.

BRIEF DESCRIPTION OF THE DRAWINGS

Other features and advantages of the present invention will become apparent when the following description is read in conjunction with the accompanying drawings, in which:

5,793,066

3

Figure 1:
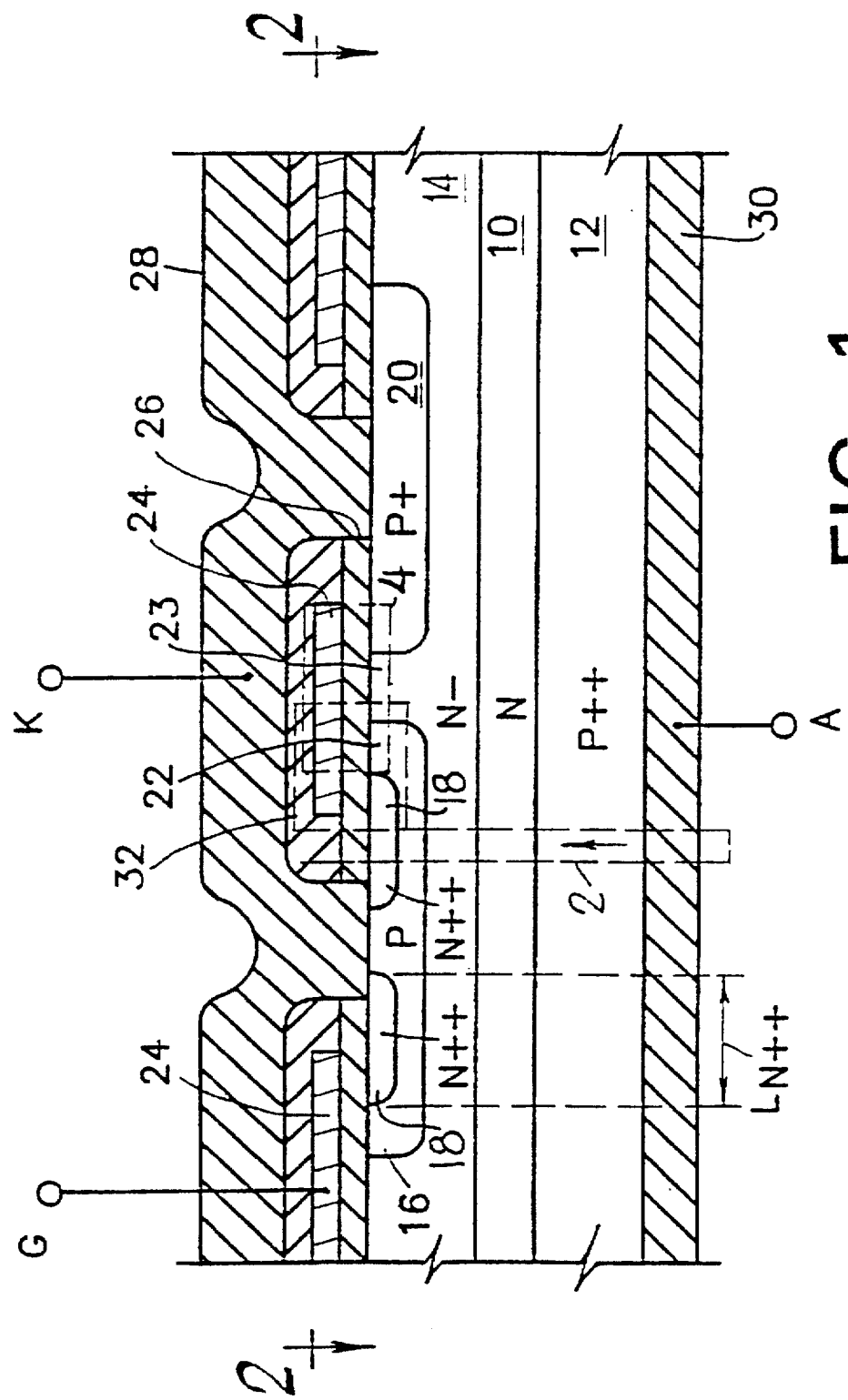
Figure 2:
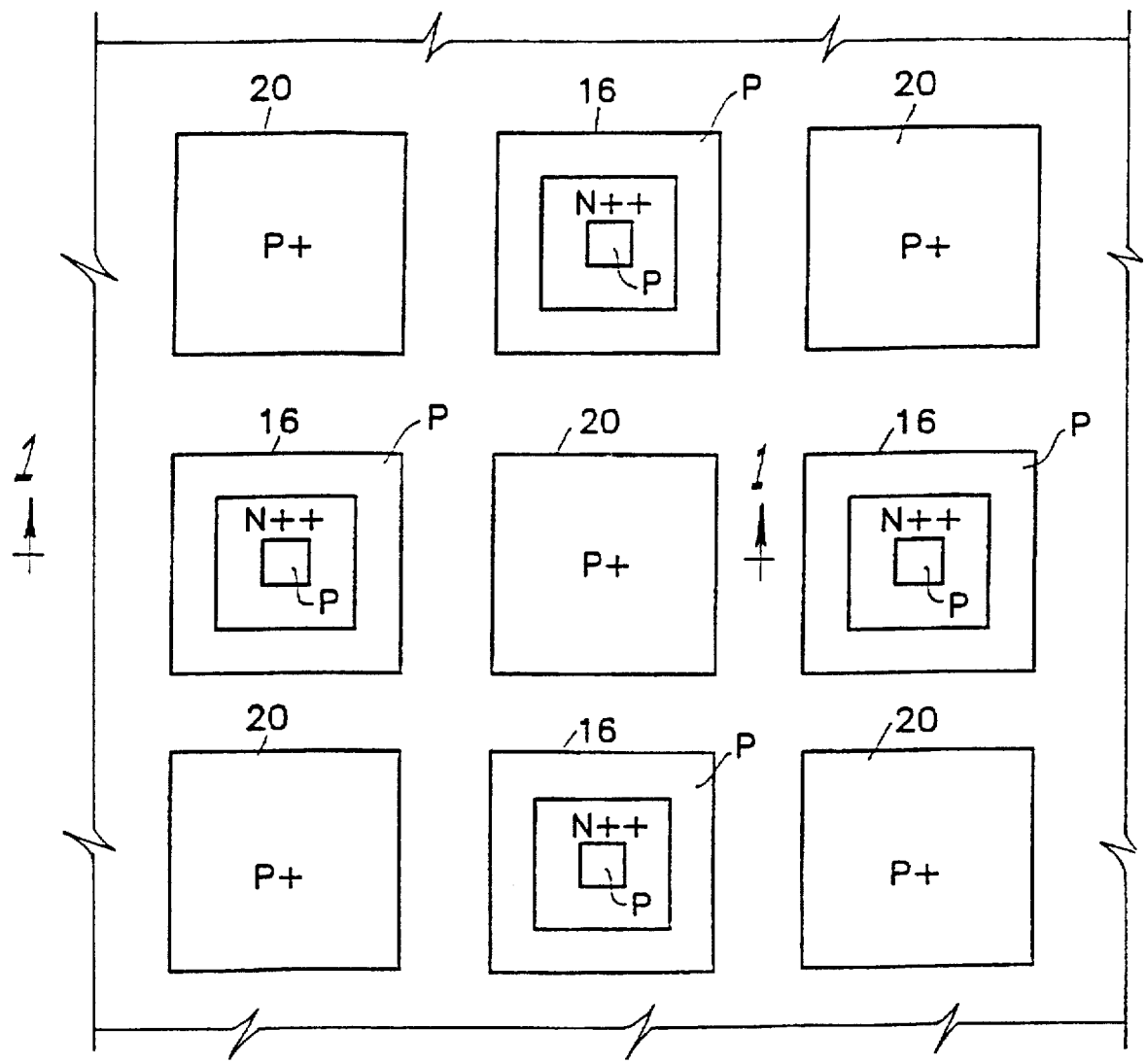
Figure 3:
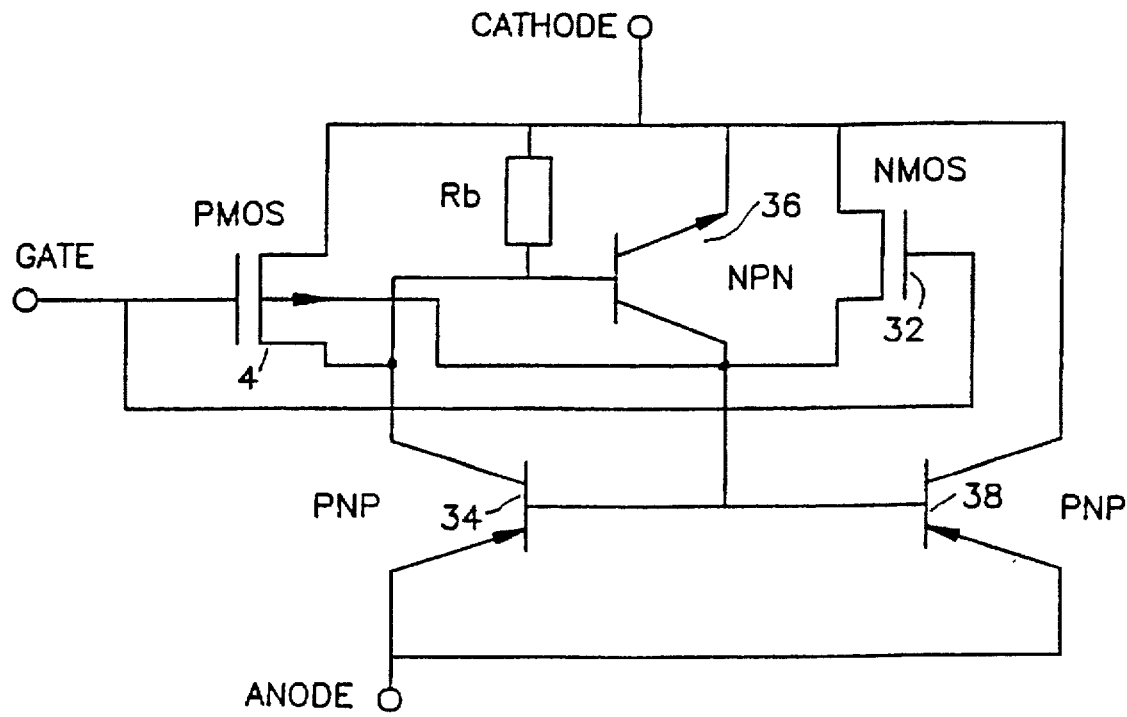
Figure 4C:
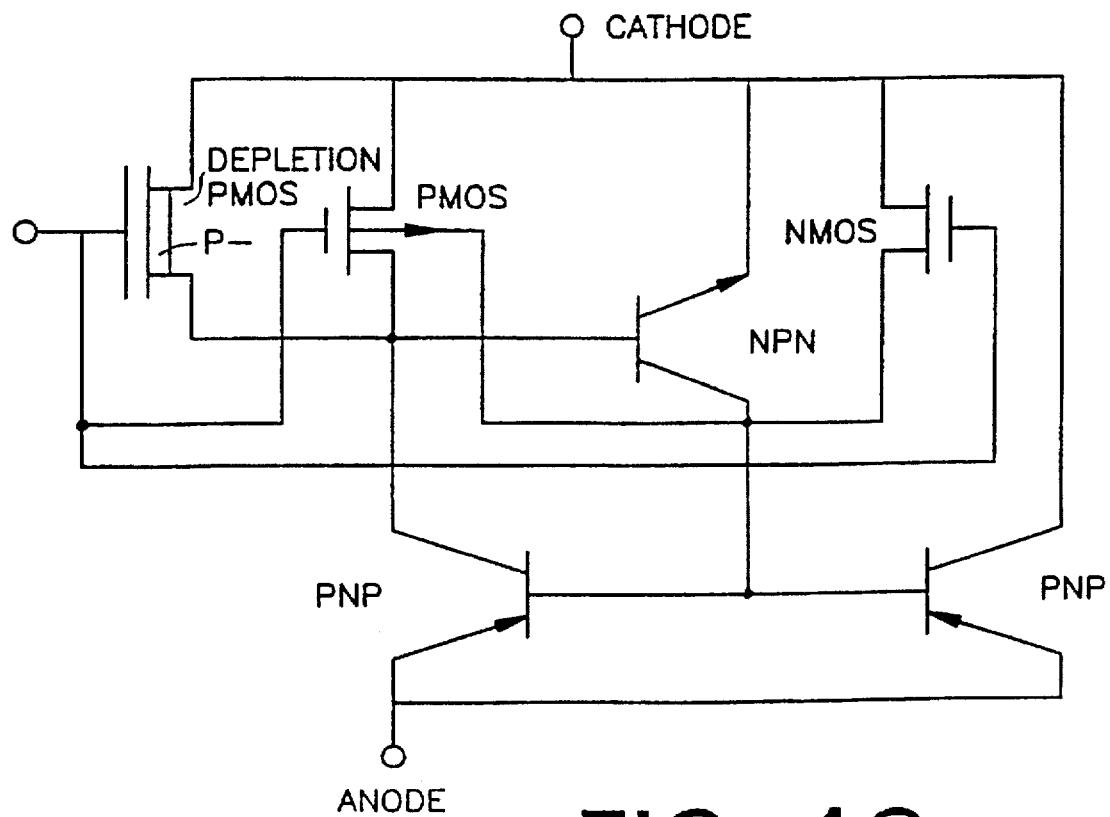
Figure 4A:
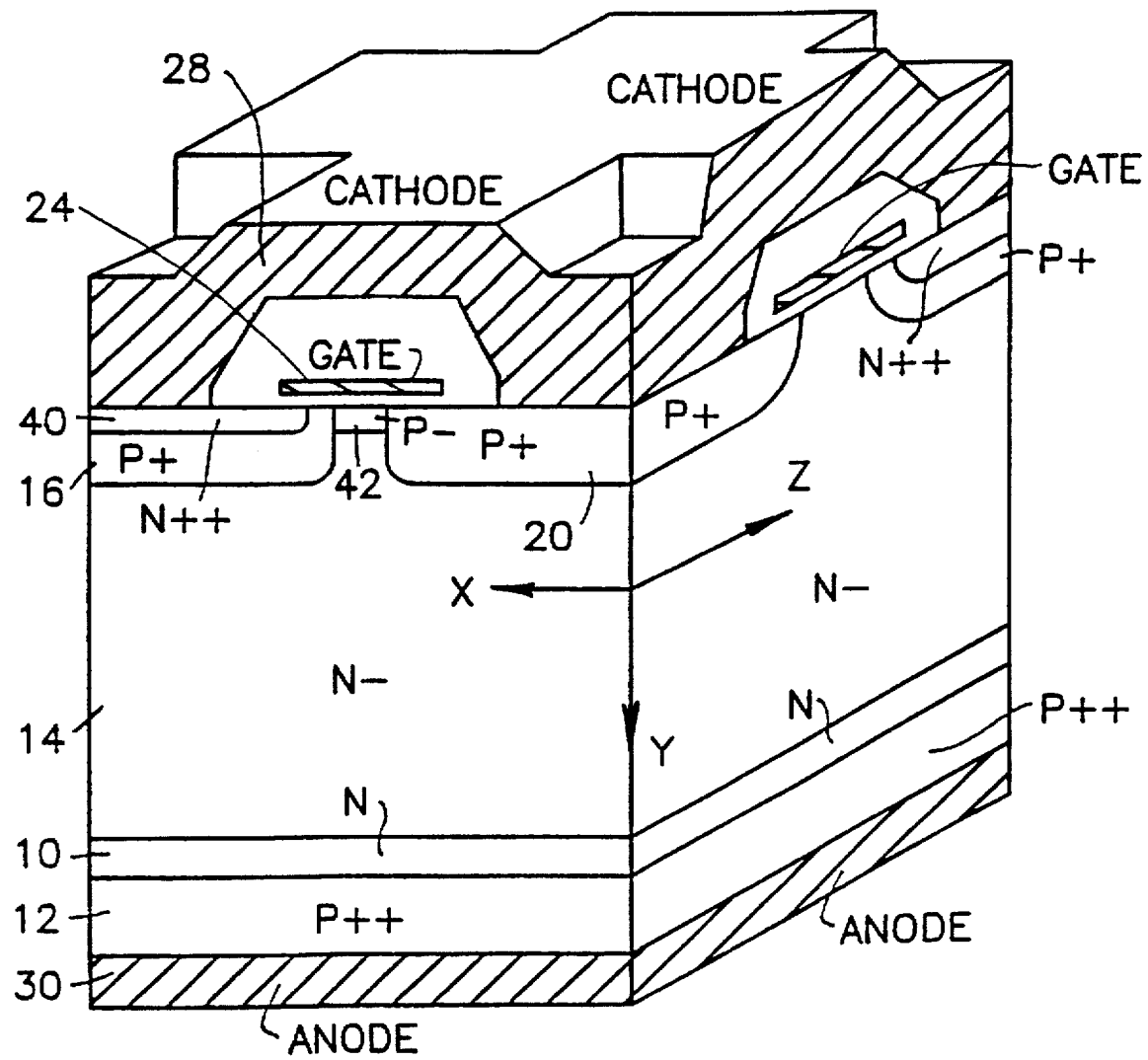
Figure 4B:
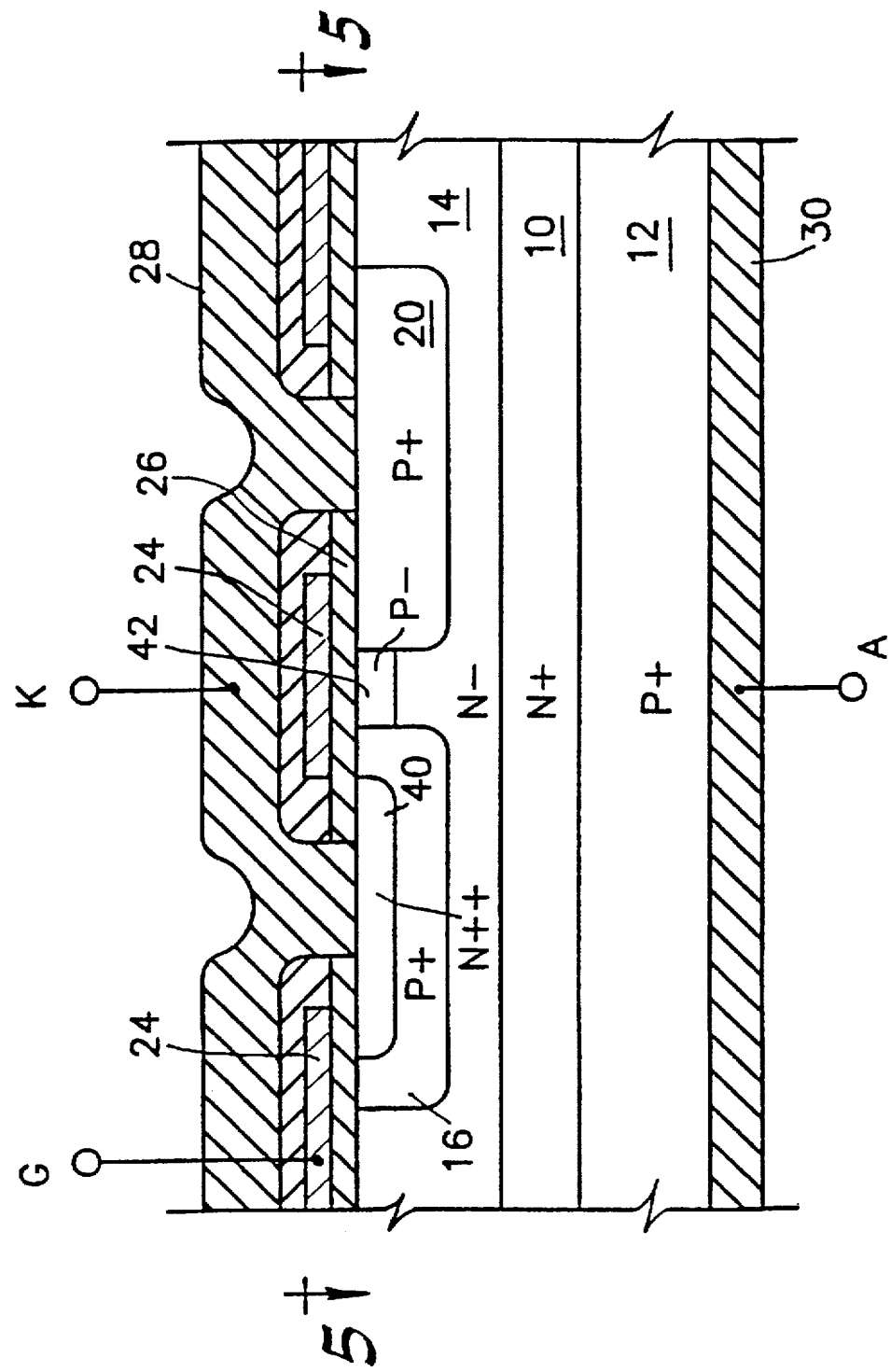
Figure 5:
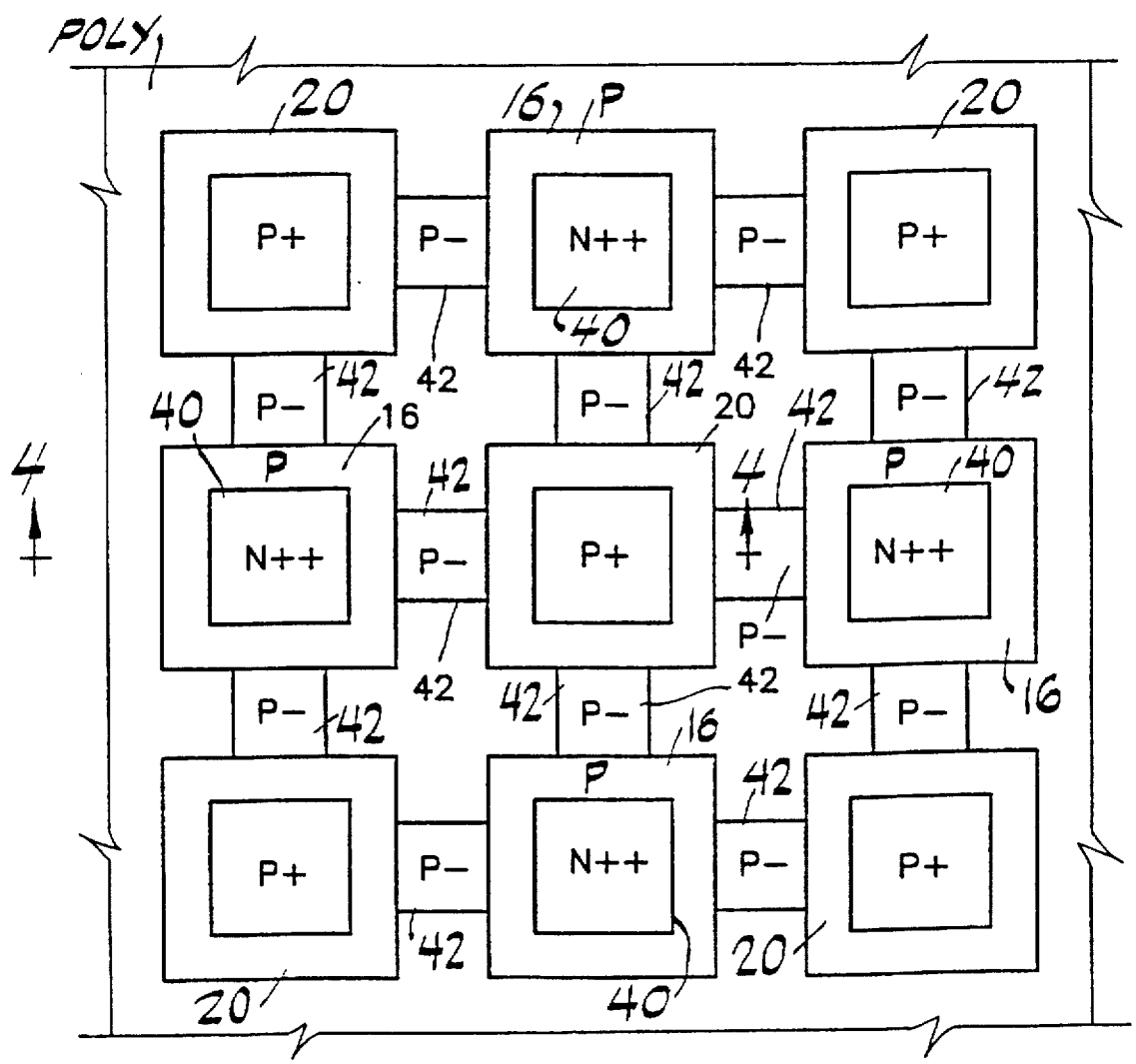
Figure 6:
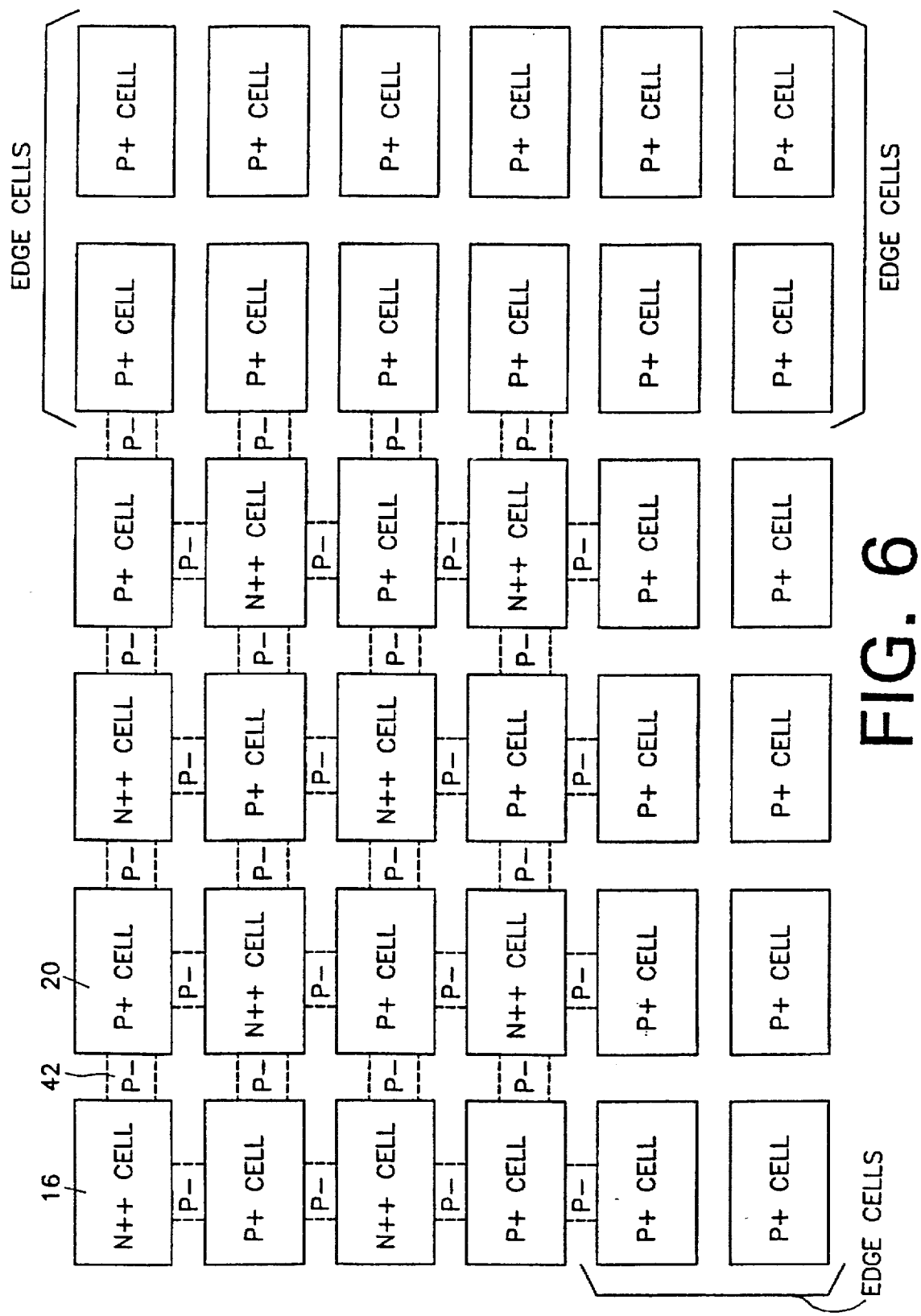
Figure 7:
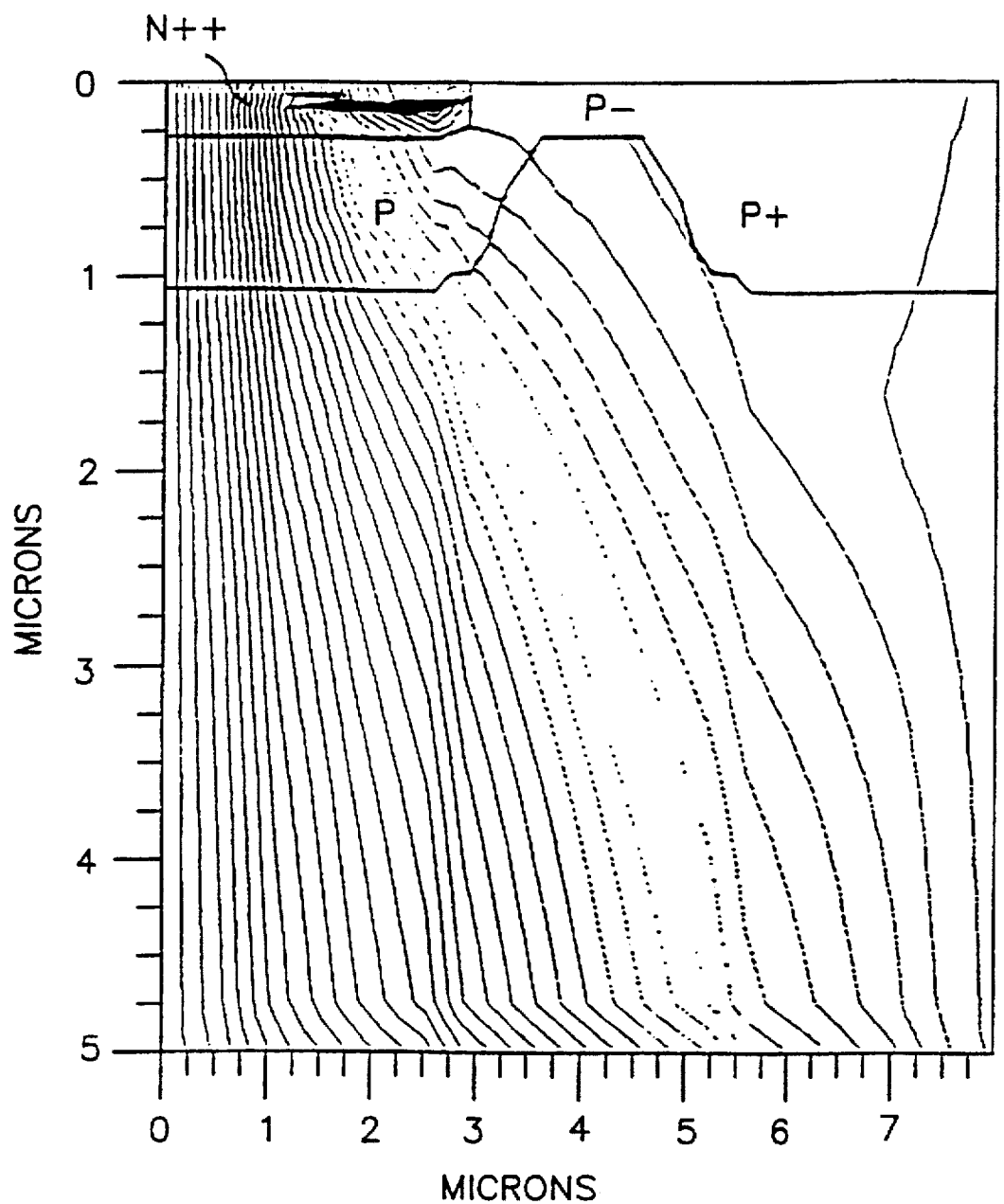
Figure 8A:
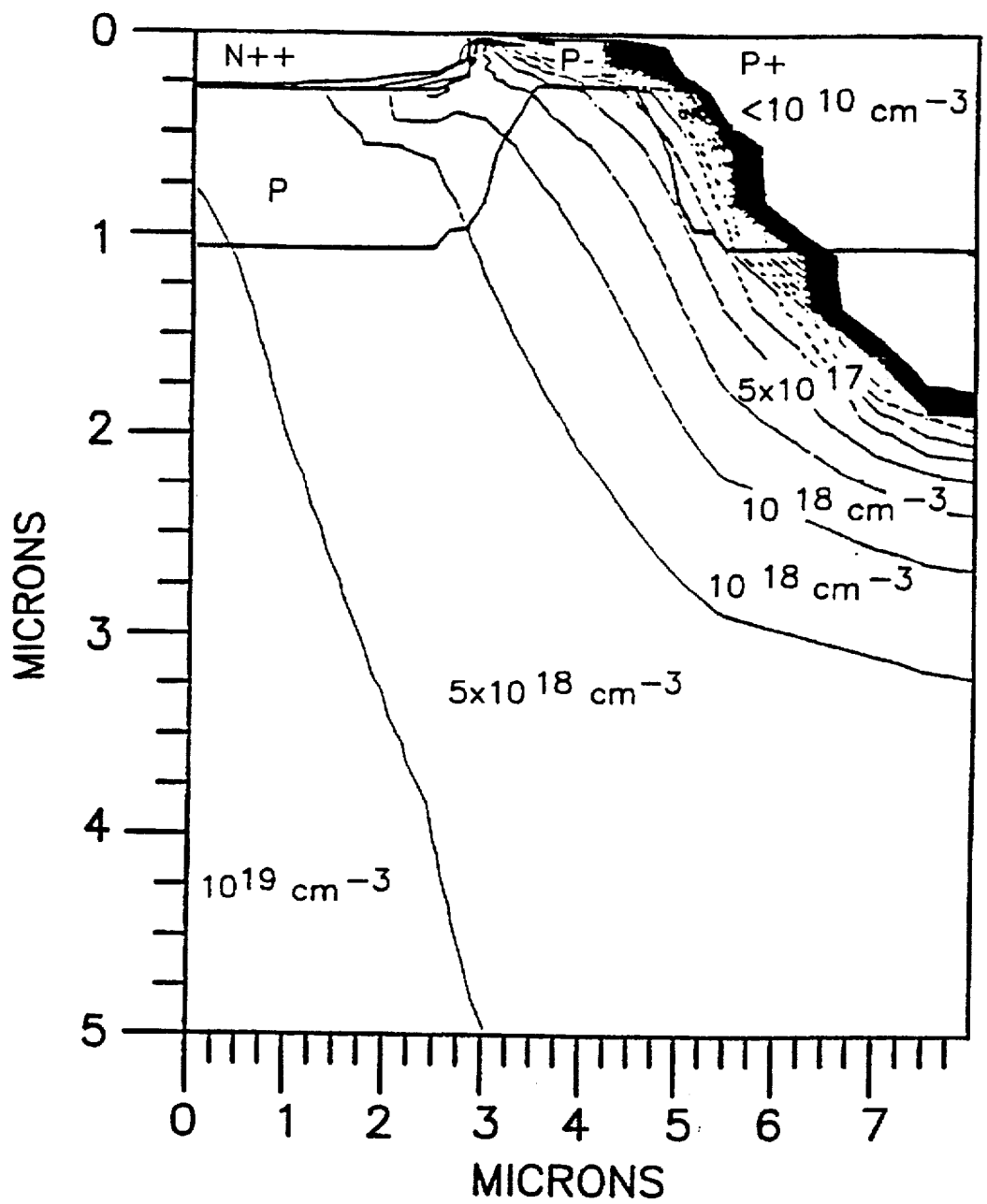
Figure 8B:
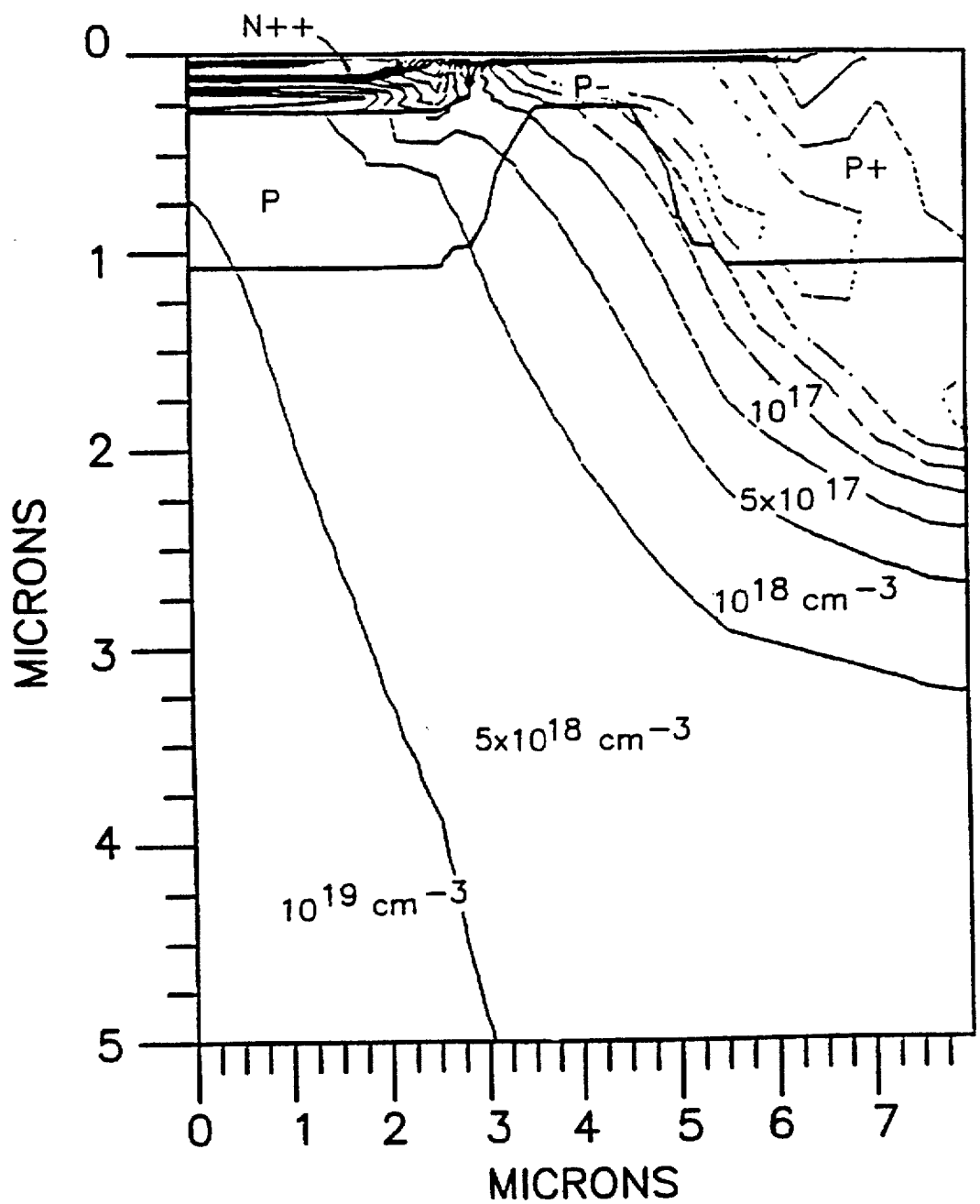
Figure 9:
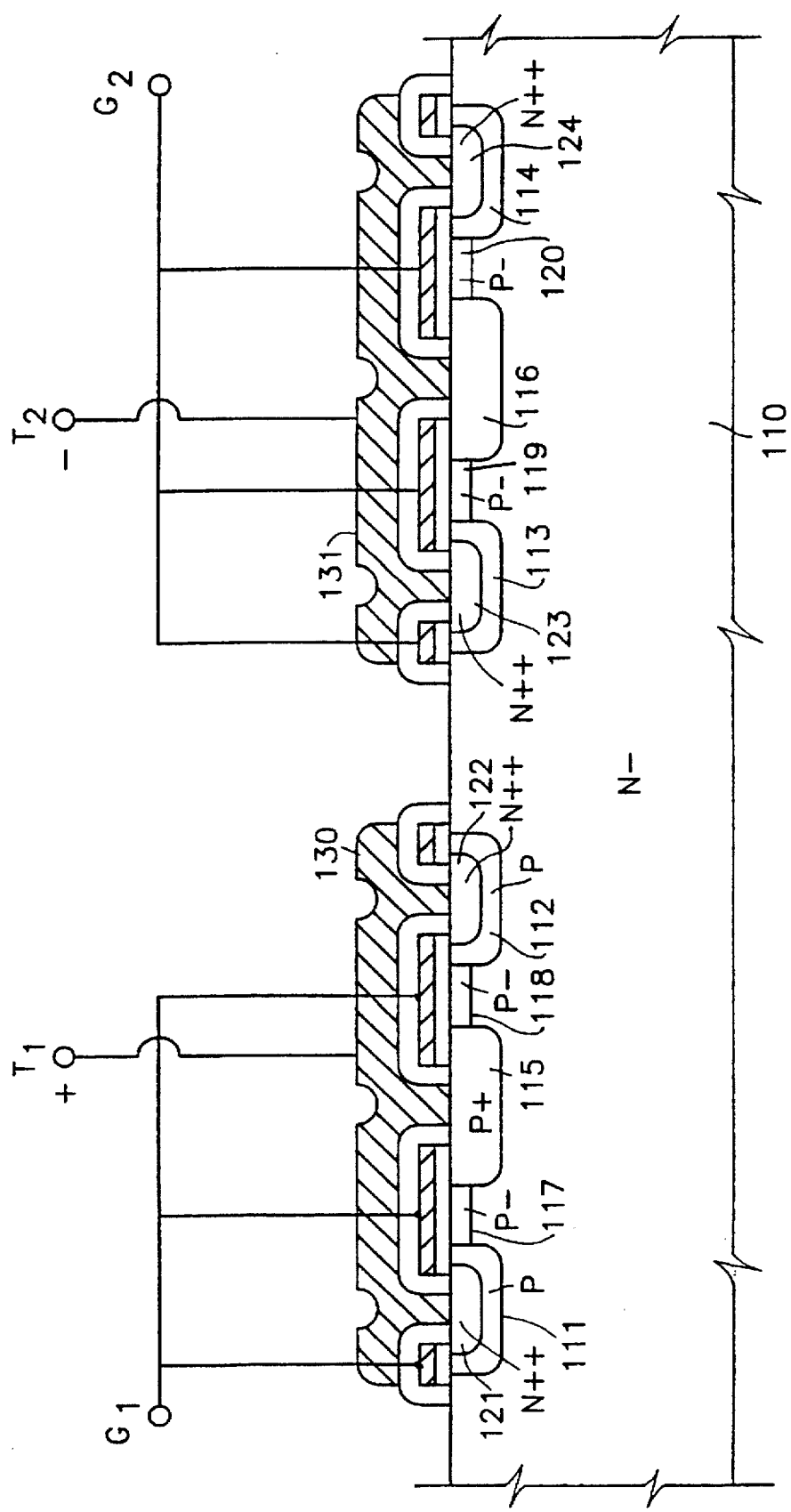
Figure 10:
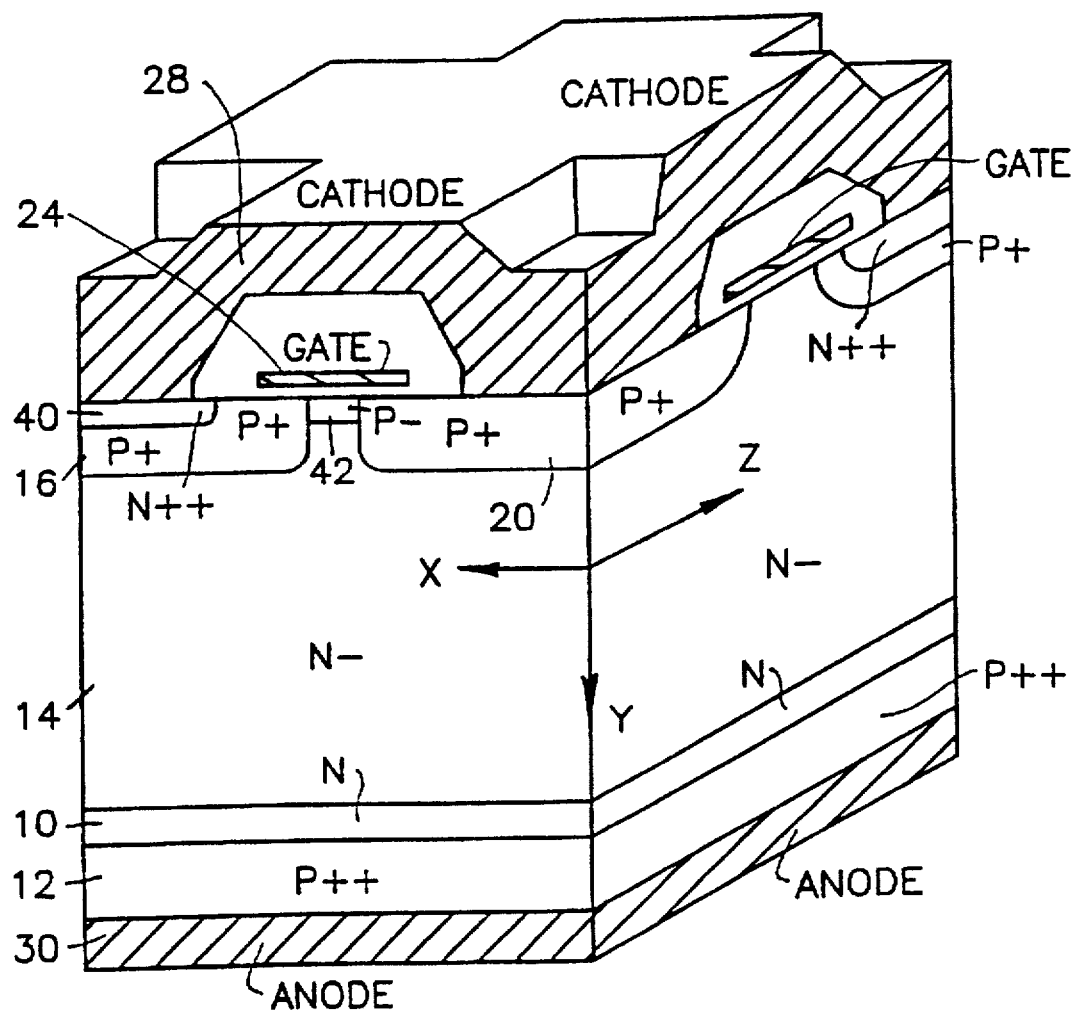
Figure 11:
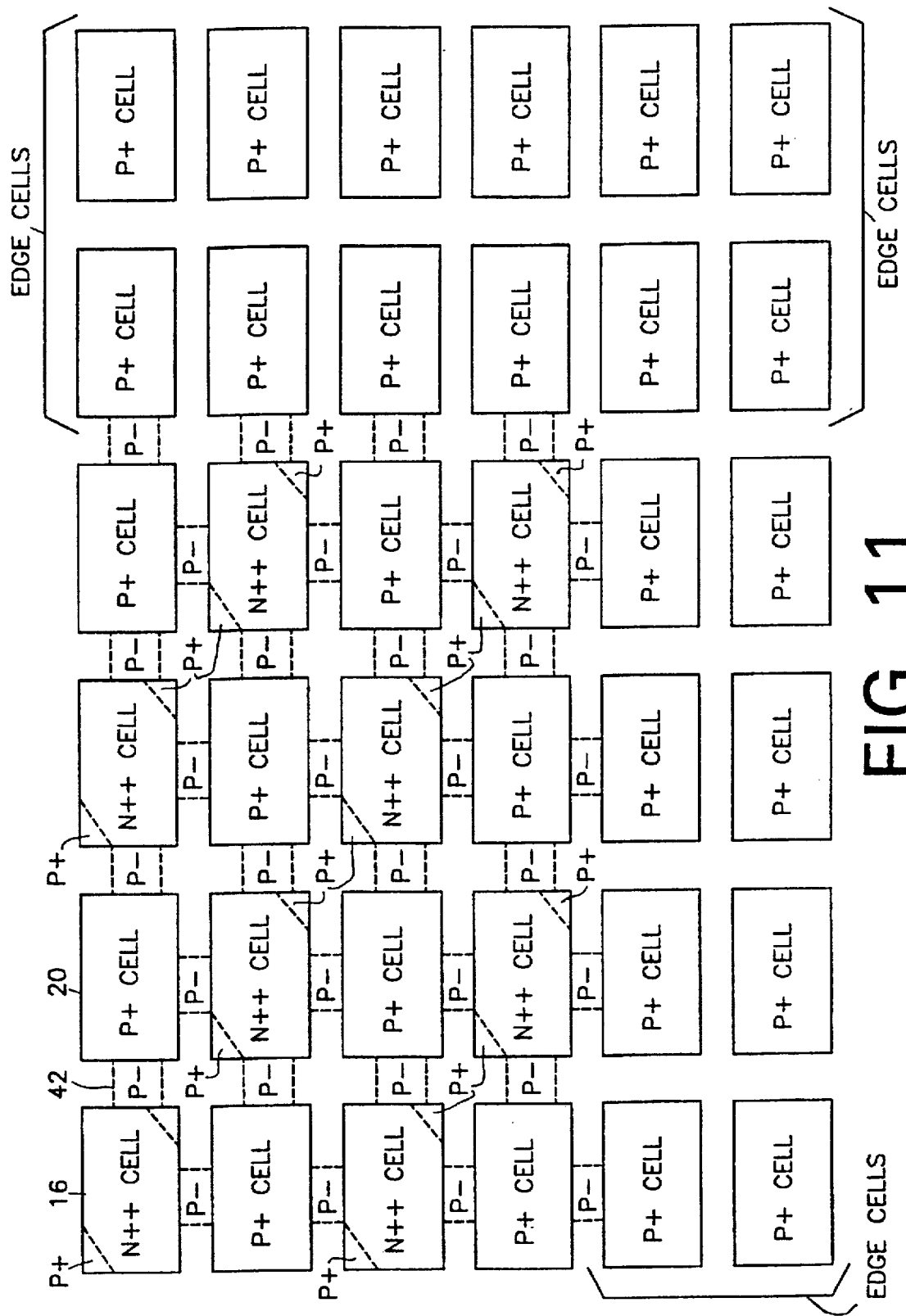
Figure 12:
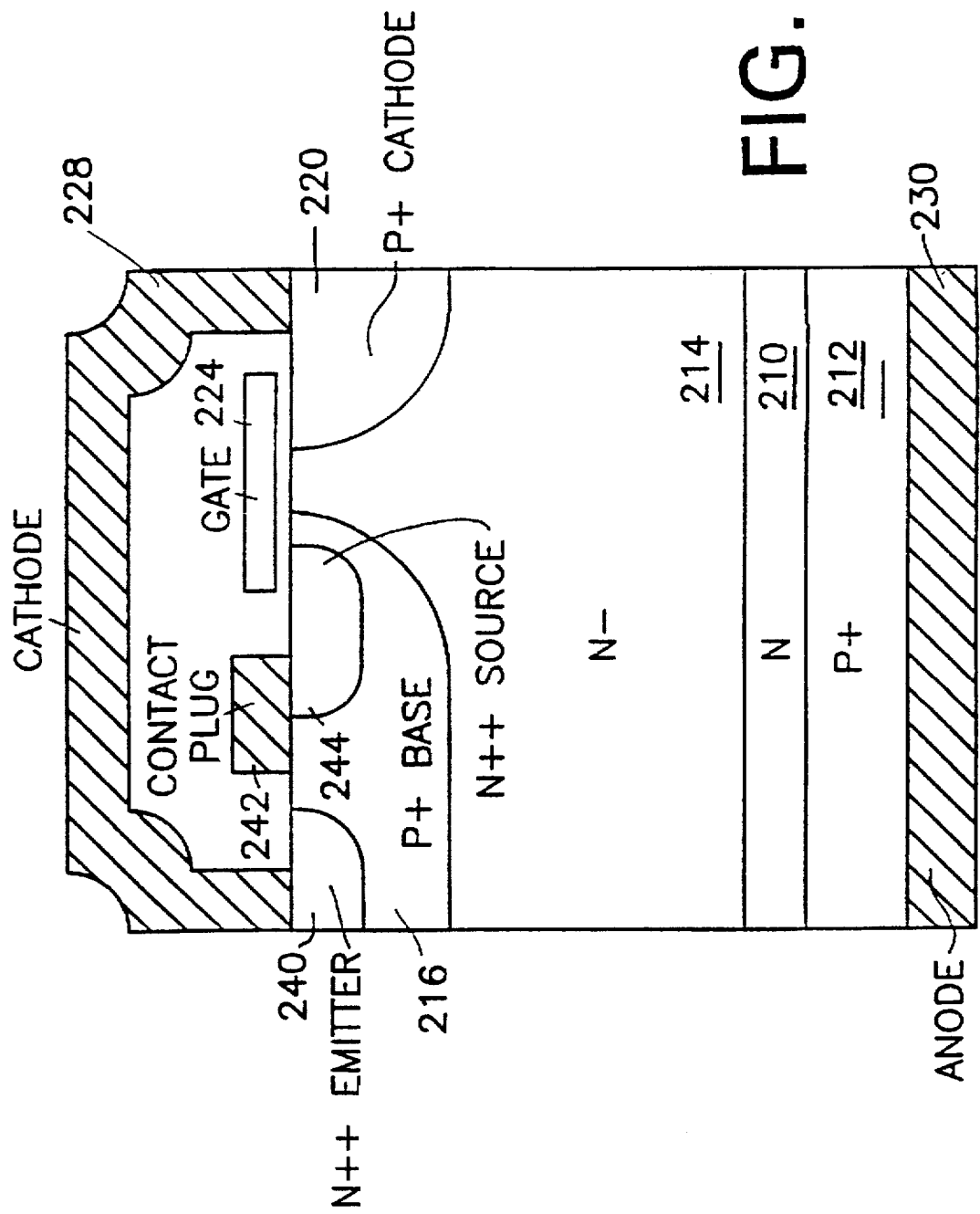
Figure 13:
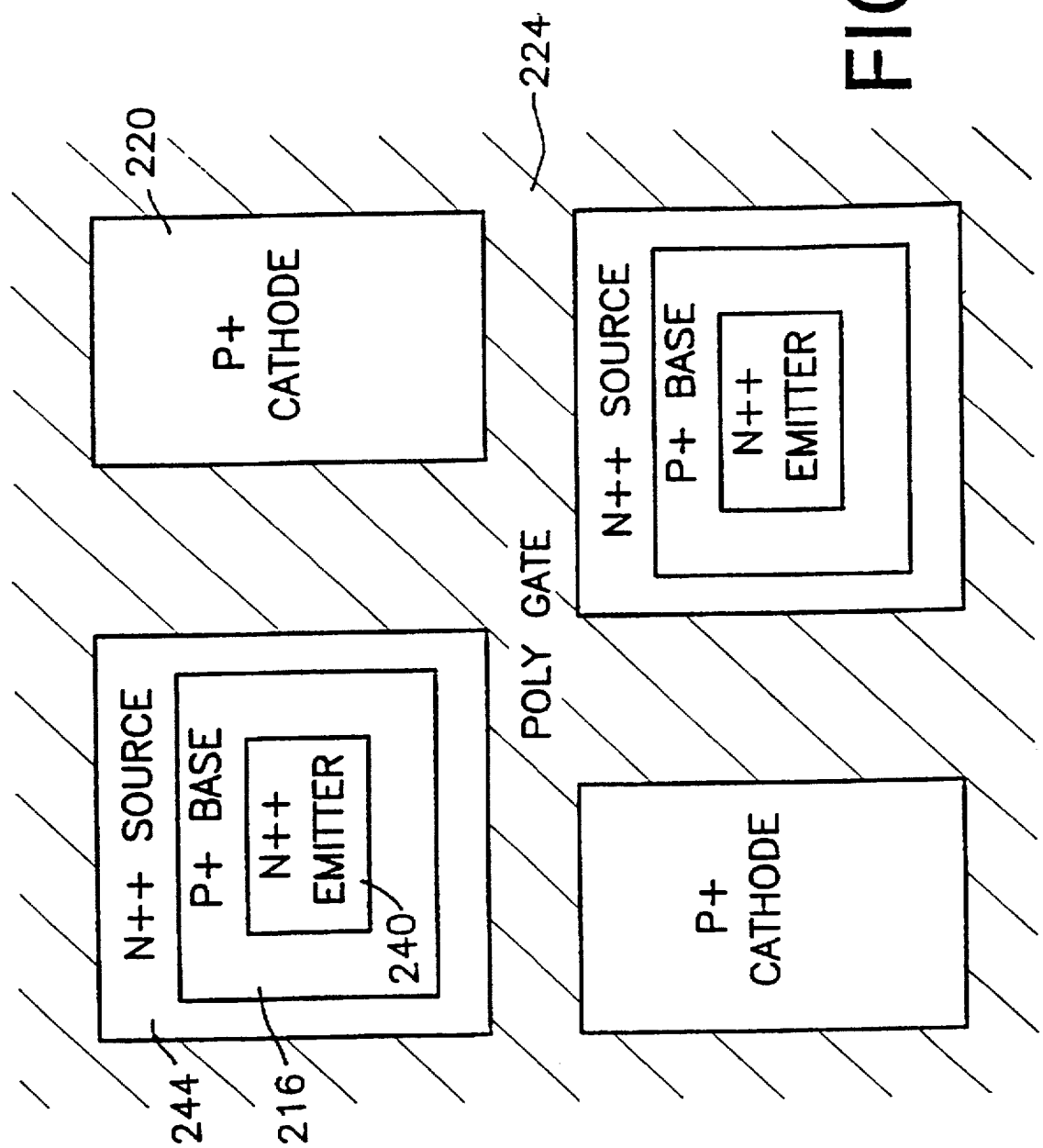
Figure 14:
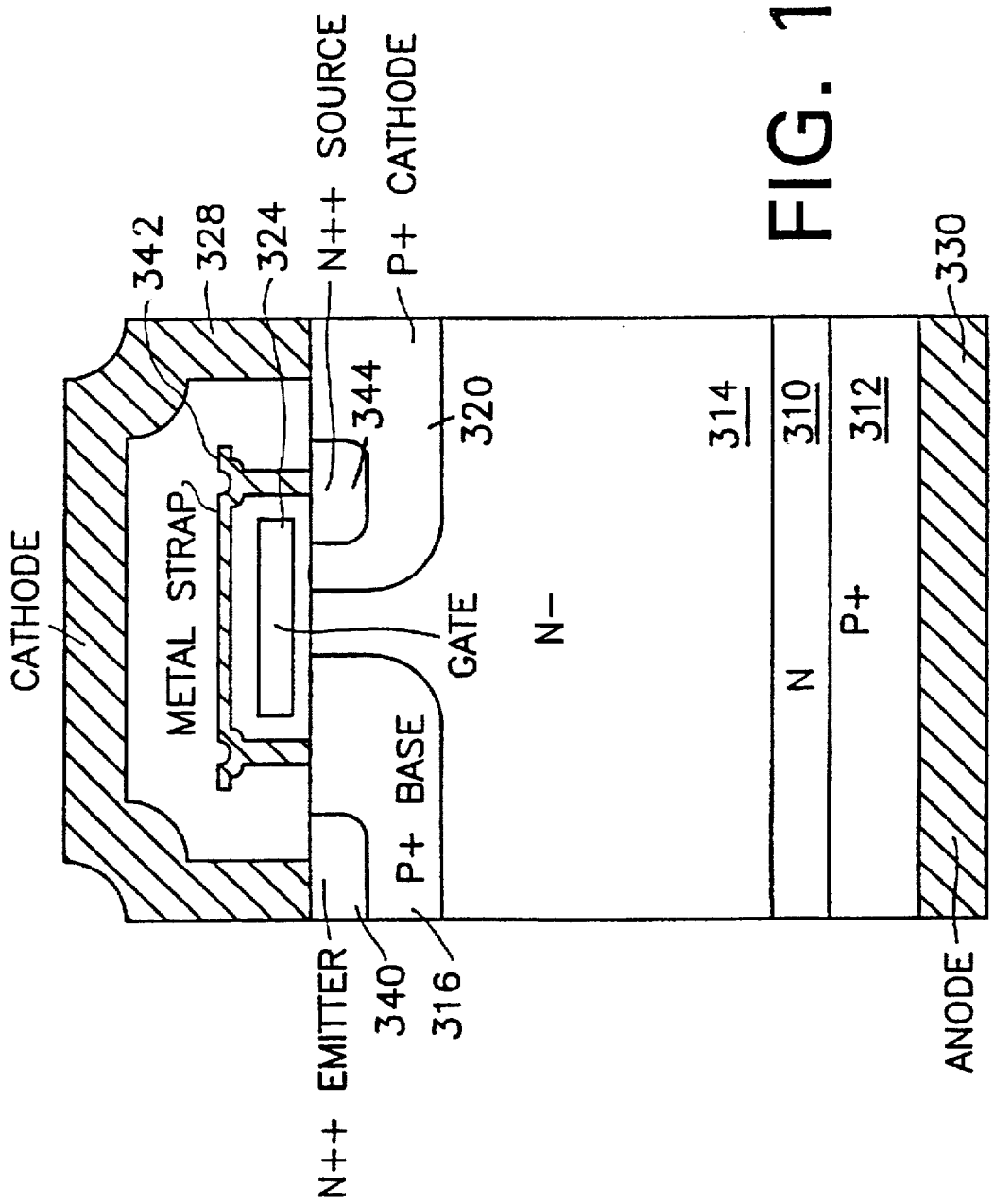
Figure 15:
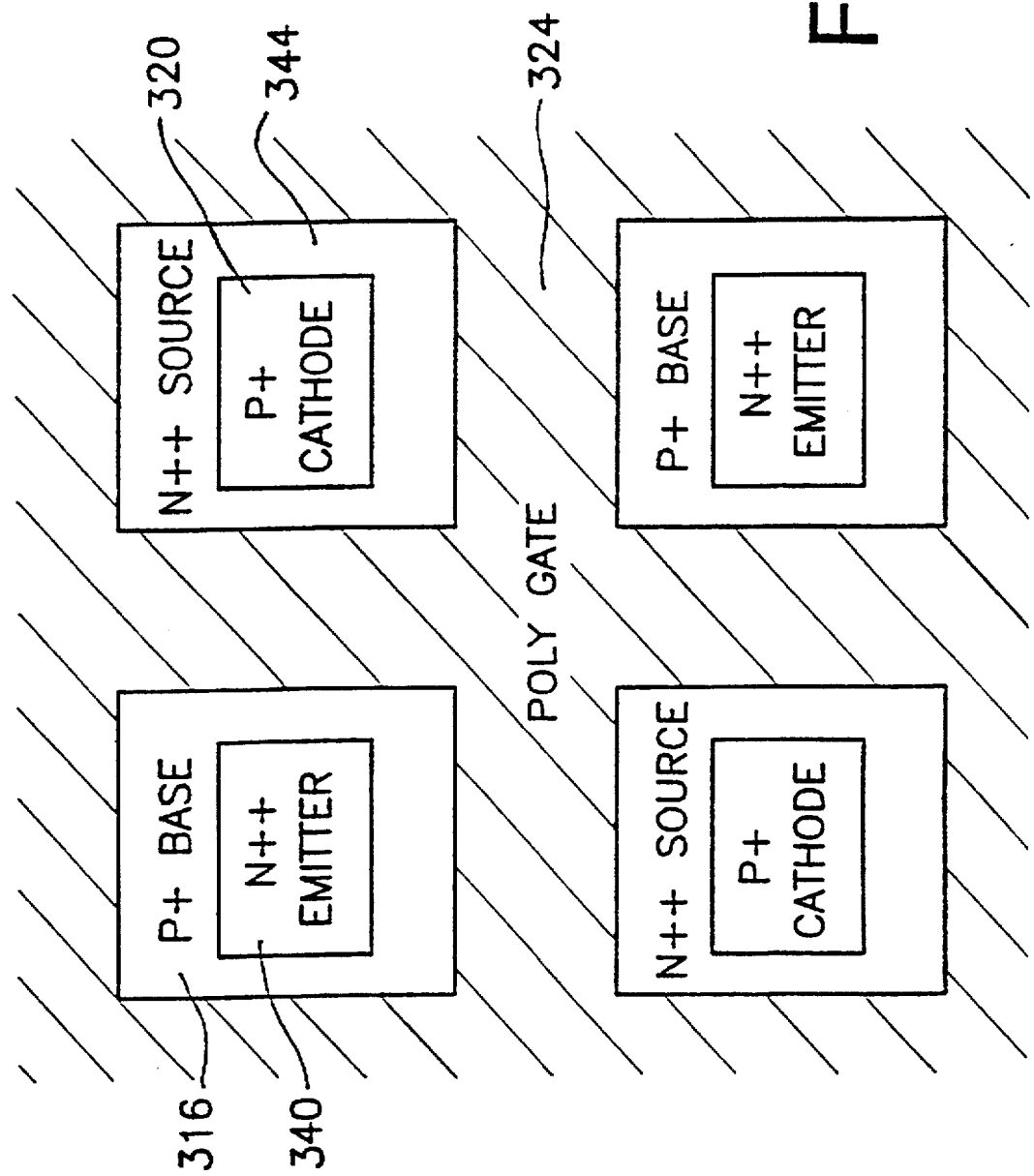

FIG. 1 is a cross-section of FIG. 2 taken along section lines 1—1 in FIG. 2 and shows a prior art BRT device;

FIG. 2 is a cross-sectional top view of FIG. 1 showing the cellular layout of a prior art BRT;

FIG. 3 shows an equivalent circuit diagram of the prior art BRT device of FIGS. 1 and 2;

FIG. 4A shows a three-dimensional view of the modified BRT structure made in accordance with the invention;

FIG. 4B is a cross-section of FIG. 5 taken along section lines 4—4 in FIG. 5 and shows a modified BRT device made in accordance with the invention, with a $P^-$ region bridging between a $N^{++}$ cell and a $P^+$ cell;

FIG. 4C shows an equivalent circuit diagram of the present invention;

FIG. 5 is a cross-sectional top view of FIG. 4 showing the cellular layout of a modified BRT device made in accordance with the invention, with $P^-$ regions bridging between the $N^{++}$ cells and the $P^+$ cells;

FIG. 6 shows the layout of the present invention at the edge of the chip;

FIG. 7 shows the on-state current flow lines in a unit cell of the present invention obtained from device simulations;

FIGS. 8A and 8B show the on-state electron and hole concentration contours, respectively, of the device of the present invention;

FIG. 9 is a cross-sectional view of the device of the present invention provided in a lateral implementation;

FIG. 10 shows the BRT structure in an embodiment of the invention in which the gate does not overlap all the edges of $N^{++}$ emitter;

FIG. 11 shows a preferred layout for structure of FIG. 10;

FIG. 12 shows the device structure of another embodiment of the invention;

FIG. 13 shows a preferred layout for the structure of FIG. 12;

FIG. 14 shows the device structure of yet another embodiment of the invention;

FIG. 15 shows a preferred layout for the structure of FIG. 14; and

Figure 16:
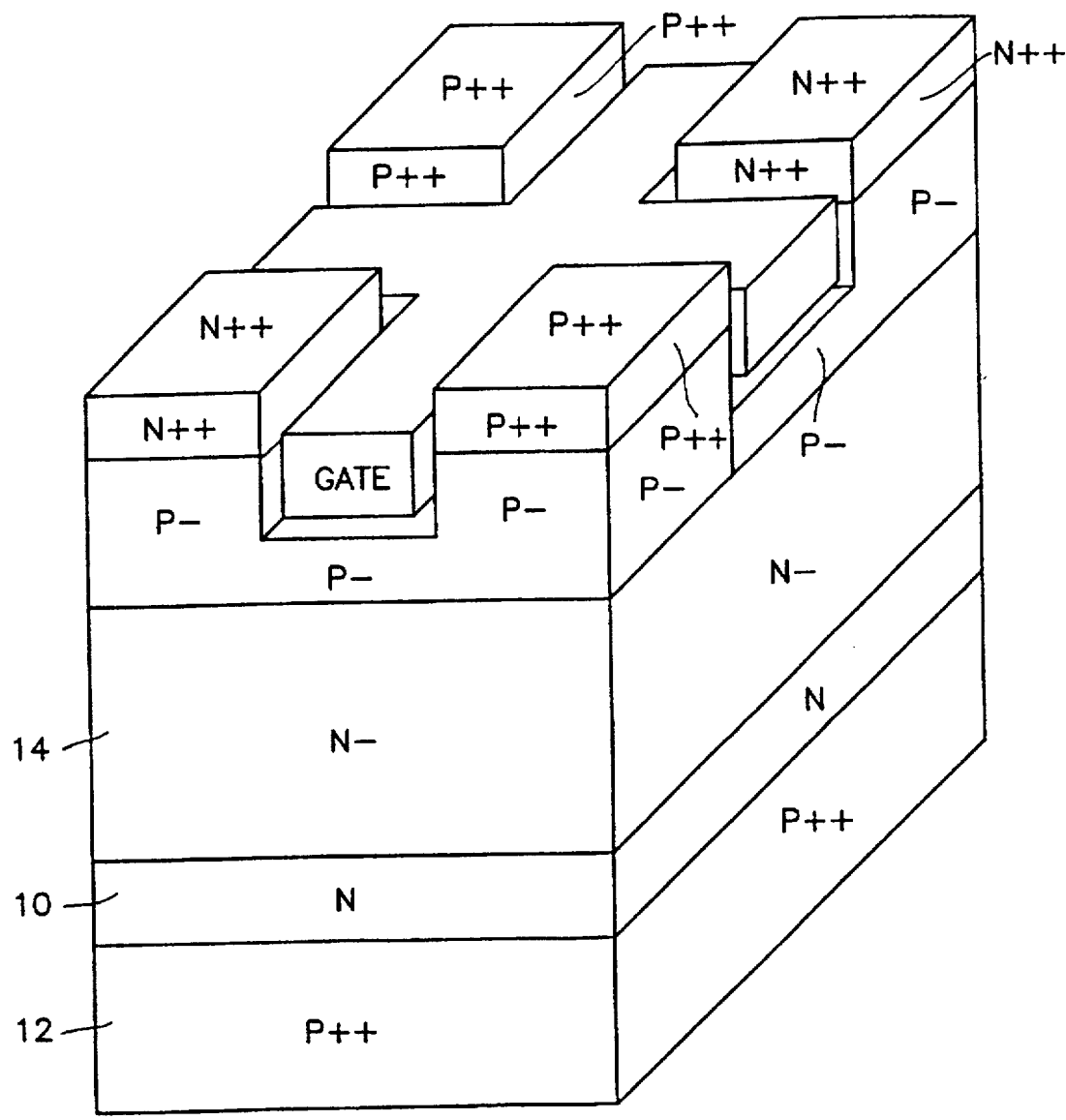

FIG. 16 shows a trench gate embodiment of the new device structure.

DETAILED DESCRIPTION OF THE PREFERRED EMBODIMENT

Referring first to FIG. 1, the prior art BRT device structure is shown. The BRT consists of a single thyristor region 2, with a p-channel MOSFET 4 adjacent to it. More specifically, as shown in FIG. 1, the BRT is formed on a silicon wafer which includes a N layer 10, an underlying $P^{++}$ layer 12, and an overlying $N^-$ epitaxial layer 14. Diffused within $N^-$ epitaxial layer 14 is a P base region 16 provided with an annular $N^{++}$ region 18, and a $P^+$ region 20 without a $N^{++}$ region.

The BRT is a four-layer P-N-P-N device similar to the insulated gate bipolar transistor (IGBT). Like the IGBT, the BRT is typically fabricated by a double diffused MOS (DMOS) process and is provided in a cellular configuration, as shown in FIG. 2. Unlike the IGBT, however, only half of the P regions on the upper surface of the BRT contain a $N^{++}$ region. The BRT also differs from the IGBT in that P base region 16 containing the $N^{++}$ region 18 is less heavily doped, so that the resistance of the base region is higher in the BRT by about an order of magnitude (hence the term "base

4 resistance controlled thyristor"). As explained below, this increases the gain of the NPN transistor of the thyristor and promotes latch-up (normally avoided in IGBTs).

With continuing reference to FIG. 1, $N^{++}$ region 18 is spaced radially inwardly from the lateral edge of P base 16 to form a n-channel region 22. A polysilicon layer 24 overlies channel region 22 and the portion 23 of $N^-$ epitaxial layer 14 extending upwardly to the top surface of the silicon wafer between P base region 16 and P base region 20. Polysilicon layer 24 is separated from the upper surface of the silicon wafer by thin layer 26 of gate oxide. A top metal layer 28 connects each $N^{++}$ region 18, P base region 16 and $P^+$ region 20 to a common cathode node K. The polysilicon gate layer 24 extends over the surface of the device with an opening at each cell (for source and body diffusion and contact) so as to form a common gate electrode connected to a gate node $G_1$. An uninterrupted metal layer 30 is disposed over the bottom surface of the device to form a bottom anode electrode A.

With reference again to the top view of FIG. 2, it can be seen that the cells of P region 16 (cells with a $N^{++}$ region 18) and those of $P^+$ region 20 (cells without a $N^{++}$ region 18) are each provided in a square topology and are arranged in an alternating checkerboard fashion. Although a square structure is shown in FIG. 1, BRTs having an other polygonal structure, e.g. an octagon—see U.S. Pat. No. 5,381,025, are well known.

Referring now to FIG. 3, the equivalent circuit of the BRT device is shown. Each cell of the BRT with a $N^{++}$ region 18 includes a n-channel MOSFET 32, a PNP transistor 34, a NPN transistor 36 and a resistor $R_b$ (the resistance of the base region). Each cell without a $N^{++}$ region 18 includes a vertical PNP transistor 38. P-channel MOSFET 4 bridges the two different cells.

PNP transistor 34 has its emitter defined by $P^{++}$ layer 12, its base by N layer 10 and $N^-$ epi layer 14, and its collector by P base 16. PNP transistor 38 has its emitter defined by $P^{++}$ layer 12, its base by N layer 10 and $N^-$ epi layer 14, and its collector by $P^+$ region 20. P-channel MOSFET 4 has its source defined by P base 16, its drain defined by $P^+$ region 20, and its channel region defined by the region 23 of $N^-$ epi layer 14 underlying the polysilicon gate 24.

In the operation of the prior art BRT of FIGS. 1–3, when a positive voltage is applied to gate 24, n-channel MOSFET 32 is turned on, allowing thyristor current to flow upward through the device as shown in FIG. 1. The device exhibits IGBT-like characteristics at low current levels. Under these conditions, hole current flows laterally through P base region 16 to the emitter short (cathode), producing a voltage drop which forward biases the emitter-base junction. At higher current levels, this voltage drop is sufficient to cause electron injection from the $N^{++}$ emitter 18, resulting in latch up of the thyristor.

The length of the emitter, which determines the base resistance $R_b$, controls the triggering and holding currents of the device. Once the thyristor is latched on, the gate bias can be removed, and the on-state current continues to flow in the thyristor section with a low forward drop.

Turn off of the BRT is accomplished by applying a negative bias to gate 24, turning on p-channel MOSFET 4 at the surface of the $N^-$ drift region. Holes are diverted from the P base region 16 of the thyristor into adjacent $P^+$ region 20 connected to the cathode. Thus, p-channel MOSFET 4 establishes a low resistance path between the P base 16 and cathode for the flow of hole current. This is equivalent to reducing the base resistance $R_b$, which results in raising the holding current of the thyristor above the operating current level. The forward bias on the emitter base junction is reduced, breaking the regenerative action and causing the thyristor to turn off. Once the turn off is initiated, the anode current decays in a finite time decided by the removal of minority carrier stored charge from the drift region.

As mentioned previously, the maximum controllable current in the BRT is primarily determined by the resistance of the turn-off MOSFET channel. The present invention seeks to minimize the on-resistance of the turn-off p-channel MOSFET 4 by increasing the channel density. This is achieved by connecting the P base region in certain regions under polysilicon gate 24 with a $P^-$ region to the $P^+$ cathode.

More specifically, referring to FIG. 4, a cross-section of the modified BRT design of the present invention is shown, wherein like elements (from the prior art BRT structure of FIG. 1) are designated with like reference numerals. As shown in FIG. 5, like the prior art BRT, the modified BRT of the present invention has a multicell layout in a checkerboard pattern of $N^{++}$ cells and $P^+$ square.

Significantly, unlike the prior art BRT of FIGS. 1–3, however, P base region 16 is not contacted by the cathode electrode 28; i.e. the present invention has a solid $N^{++}$ region 40 (a solid square in the embodiment of FIGS. 4 and 5), rather than an annular region surrounding a portion of the P base contacted by the cathode electrode. In the present invention, the $P^+$ base is connected to the cathode electrode only through a $P^-$ region 42 whose resistance is MOS gate controlled, as shown in FIGS. 4 and 5. This enables smaller cell dimensions and realization of a higher MOS channel density.

A positive bias on the gate depletes $P^-$ region 42 to achieve a high base resistance to latch the thyristor. For turn-off, the gate voltage is reduced from positive to negative to cause accumulation of holes in $P^-$ region 42. An inversion layer of holes is also formed in the $N^-$ diagonal regions between cells. This reduces the base resistance forming a low resistance path diverting the holes to bring the thyristor out of the latched state. A low channel resistance for the turn-off p-channel MOSFET in this design results in a high controllable current density.

In the boundary regions of the die, a higher current density results during turn-off due to the lateral spread of the carrier plasma during the on-state of the thyristor structure, similar to that in MCTs as reported in H. Lendenmann et al., "Approaching homogeneous switching of MCT devices: Experiment and Simulation", *Proceedings of the ISPSD*, pp. 66–70, 1993. Accordingly, as shown in FIG. 6, the edge cells of the device of the present invention are preferably all $P^+$ cells to avoid current crowding during turn-off to achieve a high controllable current for a large die size.

The on-state current flow lines obtained from simulations of the device of the present invention are shown in FIG. 7. It can be seen that most of the current flows through the thyristor region with a small amount of current flowing through the PNP region. The on-state electron and hole concentration contours in the device are shown in FIG. 8A and FIG. 8B, respectively. It can be seen from these figures that the entire $N^-$ drift region is conductivity modulated below a depth of 2 μm from the surface of the device and almost the entire $N^-$ drift region is advantageously utilized for current conduction.

The device of the present invention is fabricated using a double-diffused DMOS process. The first mask is used to define the active area of the device. A N enhancement implant of phosphorus at a dose of $1\cdot5e12$ cm$^{-2}$ at 50 KeV is then optionally done. A photo-resist mask is then used to define the $P^-$ implantation regions followed by implantation of boron dose of 5e12 cm$^{-2}$ at 30 KeV. This is followed by growth of gate oxide (500 Å). This is followed by deposition and patterning of polysilicon using a third mask. The $P^+$ base regions and $P^+$ regions are formed self-aligned to the polysilicon by boron implantation of 2e14 cm$^{-2}$ at 50 KeV. The next mask is used to define the $N^{++}$ emitter regions. This is followed by low temperature oxide deposition and opening of the contact windows using a fifth mask. Metal (Aluminum) is then deposited and patterned using a sixth mask. A passivating material is then deposited and the patterned using the seventh mask. The last stage of the process consists of grinding part of the backside substrate and deposition of back metal.

Although the present invention is depicted in a square cellular configuration for ease of simplicity and ease of illustration, it should be apparent to one of ordinary skill in the art that, like the BRT and other power semiconductor devices, the present invention can be provided in other polygonal configurations. Indeed, as mentioned above, device simulations show that almost the entire $N^-$ drift region is utilized for current conduction, even though the $N^{++}$ emitter is only 50% of the total active area. This indicates that the $N^{++}$ area can be reduced further in size without an increase in on-state voltage drop in order to increase the $P^+$ cell area/channel density to obtain an increase in the maximum controllable current. A hexagonal cell layout, analogous to that disclosed in U.S. Pat. No. 5,008,725 (the disclosure of which is herein incorporated by reference), with each $N^{++}$ cell surrounded by six $P^+$ cells (with $P^+$ to $N^{++}$ cells in the ratio of 3:1) would increase the turn-off channel density over the square-cellular design.

In the device of FIGS. 4 and 5, a representative design would have cell pitch of about 8 microns, and a poly line width of about 3 microns. The $P^+$ base and $P^+$ regions preferably have a depth of from 1.0 to 1.5 microns, and the $N^{++}$ regions have a depth of about 0.3 microns.

Referring to FIG. 9, a lateral counterpart of the device of FIGS. 4 and 5 is shown, in which $N^-$ layer 114 receives a plurality of spaced P base regions 111 to 114 distributed over the surface of the chip. $P^+$ regions 115 and 116 are disposed between $P^+$ base regions 111–112 and 113–114, respectively, and are "connected" thereto by $P^-$ regions 117–118 and 119–120, respectively. $P^+$ base regions 111 to 114 receive respective $N^{++}$ source regions 121–124.

Polysilicon gate segments overlie gate oxide layers as shown, and all gates for the channels formed in P base regions 111 and 112 are connected together at terminal $G_1$. Similarly, the polysilicon gates for the channels formed in P base regions 113 and 114 are connected together at gate $G_2$.

A first aluminum contact 130 overlies the channels of P base regions 111 and 112 and contacts $N^{++}$ regions 121 and 122 and $P^+$ region 115. Contact 130 is insulated from the polysilicon gate electrodes by a suitable interlayer oxide. Similarly, a second aluminum contact 131 overlies the channels formed in P base regions 113 and 114 and contacts $N^{++}$ regions 123 and 124 and $P^+$ region 116.

The operation of the device of FIG. 9 is similar to that of FIGS. 4 and 5. Thus, terminals $T_1$ and $T_2$ correspond to terminals K and A respectively in FIG. 4. In FIG. 9, however, holes will travel laterally, for example, from P base region 112 to P base regions 113 and 116 during operation. Also, gates $G_1$ and $G_2$ are in antiphase relation to achieve bidirectional thyristor action. Thus, to turn on the device of FIG. 9, gate $G_1$ is made negative and gate $G_2$ is made positive. To turn the device off, gate $G_1$ is made positive and gate $G_2$ is made negative.

In the prior art BRT and the embodiments of the present invention described above, there is a lateral PNP transistor inherent in the structure consisting of $P^+$ base as the emitter, $N^-$ region as the base, and $P^+$ cathode as the collector. The base drive for this lateral PNP transistor is provided by electrons from $N^{++}$ emitter. This lateral PNP transistor causes two undesirable effects:

1) it shunts part of the base drive for NPN transistor increasing the on-state voltage drop in the device; and 2) it causes heavy injection of carriers into the $N^-$ region between cell diffusions. The presence of a high concentration of carriers in the $N^-$ region at the surface makes it difficult to deplete this charge and form an inversion p-channel using the MOS gate. This reduces the turn-off current capability of the device. The effect of the lateral PNP transistor can be reduced by bringing the $N^{++}$ emitter inwards from the poly gate in some regions as shown in FIG. 10. The layout of such a structure is shown in FIG. 11.

A modified structure in which the P base is biased to a higher potential in the on-state through a metal strap and an n-channel DMOS is shown in FIG. 12. In this structure, the NPN transistor is turned-on before the PNP transistor. Turn-on is accomplished by using a positive gate voltage pulse. Application of a positive voltage to gate 224 turns-on the n-channel DMOS connecting the P base 216 to anode potential through a metal strap (contact plug 242) and n-channel DMOS. When the anode voltage is increased, the potential of the P base 216 increases and, when the P base potential becomes 0.7V, the NPN transistor turns on, injecting electrons into the $N^-$ drift region 214. These electrons supply the base drive for the PNP transistor, activating the PNP transistor and consequently latching the thyristor. Note that in this device structure, the P base/$N^-$ drift region junction near the MOS gate is reverse biased and so no carriers are injected in this direction.

The device of FIG. 12 can be turned-off by applying a negative gate pulse to form a p-channel MOSFET connecting $p^+$ base 216 to $P^+$ cathode 220. The absence of excess carriers under the MOS gate 224 makes formation of inversion p-channel easier in this structure. A possible layout of this structure is shown in FIG. 13. A modification of this structure and its layout is shown in FIG. 14 and FIG. 15, respectively, wherein corresponding elements are identified by "300 series" numbers, rather than "200 series" numbers.

Although the present invention has been described in relation to particular embodiments thereof, many other variations (such as using a trench gate as shown in FIG. 16) and modifications and other uses will become apparent to those skilled in the art. It is preferred, therefore, that the present invention be limited not by the specific disclosure herein, but only by the appended claims.

What is claimed is:

1. An insulated gate thyristor comprising a silicon chip having:

a bottom layer of $P^+$ concentration;

a layer of $N^+$ concentration disposed above said bottom layer;

a $N^-$ layer disposed above said $N^+$ layer;

a plurality of spaced $N^{++}$ cells symmetrically distributed over said $N^-$ layer, said $N^{++}$ cells each comprising a $N^{++}$ emitter region contained within and spaced from an edge of a P-type cellular base region to form a respective channel;

a plurality of spaced $P^+$ cells symmetrically distributed over said $N^-$ layer, said $N^{++}$ cells being interspersed in checkerboard fashion with said $P^+$ cells, whereby each of said $N^{++}$ cells is surrounded by and spaced from adjacent ones of said $P^+$ cells;

gate means disposed atop the channels of said $N^{++}$ cells, and atop a space between adjacent $N^{++}$ cells and $P^+$ cells;

a cathode contact connected to at least a portion of said plurality of said $P^+$ cells and connected to at least a portion of said $N^{++}$ emitter regions of said plurality of $N^{++}$ cells, but not connected to said P-type cellular base regions of said plurality of $N^{++}$ cells; and means for providing a high base resistance between adjacent $N^{++}$ cells and said $P^+$ cells when a positive potential is applied to said gate to facilitate latching of said thyristor and thereby reduce the amount of space required between adjacent $N^{++}$ cells and said $P^+$ cells, said means comprising a plurality of $P^-$ diffusions extending between and connecting adjacent $N^{++}$ cells and $P^+$ cells.

2. The device of claim 1, further comprising an anode contact connected to said bottom $P^+$ layer.

3. The device of claim 1, wherein said cathode contact is connected to a first group of adjacent ones of said $P^+$ cells and said $N^{++}$ emitter regions, and further comprising an anode contact connected to a second group of adjacent ones of said $P^+$ cells and said $N^{++}$ emitter regions, said anode contact being disposed atop said chip in lateral relation to said cathode contact, said first and second groups of adjacent $P^+$ cells and $N^{++}$ emitter regions each having separate respective ones of said gate means, said gate means of said first group of adjacent $P^+$ cells and $N^{++}$ emitter regions being operated in antiphase relation with said gate means of said second group of adjacent $P^+$ cells and $N^{++}$ emitter regions.

4. The device of claim 1, further comprising a plurality of adjacent $P^+$ cells disposed at an outer periphery of said chip.

5. An insulated gate thyristor comprising a silicon chip having:

a bottom layer of $P^+$ concentration;.

a layer of $N^+$ concentration disposed above said bottom layer;

a $N^-$ layer disposed above said $N^+$ layer;

a plurality of spaced $N^{++}$ cells symmetrically distributed over said $N^-$ layer, said $N^{++}$ cells each comprising a $N^{++}$ emitter region contained within and spaced from an edge of a P-type cellular base region to form a respective channel in selected areas of the device;

a plurality of spaced $P^+$ cells symmetrically distributed over said $N^-$ layer, said $N^{++}$ cells being interspersed in checkerboard fashion with said $P^+$ cells, whereby each of said $N^{++}$ cells is surrounded by and spaced from adjacent ones of said $P^+$ cells;

gate means disposed atop the channels of said $N^{++}$ cells, and atop a space between adjacent $N^{++}$ cells and $P^+$ cells;

a cathode contact connected to at least a portion of said plurality of said $P^+$ cells and connected to at least a portion of said $N^{++}$ emitter regions of said plurality of $N^{++}$ cells, but not connected to said P-type cellular base regions of said plurality of $N^{++}$ cells; and means for providing a high base resistance between adjacent $N^{++}$ cells and said $P^+$ cells when a positive potential is applied to said gate to facilitate latching of said thyristor and thereby reduce the amount of space required between adjacent $N^{++}$ cells and said $P^+$ cells, said means comprising a plurality of $P^-$ diffusions extending between and connecting adjacent $N^{++}$ cells and $P^+$ cells.

6. The device of claim 5, further comprising an anode contact connected to said bottom $P^+$ layer.

7. The device of claim 5, wherein said cathode contact is connected to a first group of adjacent ones of said $P^+$ cells and said $N^{++}$ emitter regions, and further comprising an anode contact connected to a second group of adjacent ones of said $P^+$ cells and said $N^{++}$ emitter regions, said anode contact being disposed atop said chip in lateral relation to said cathode contact, said first and second groups of adjacent $P^+$ cells and $N^{++}$ emitter regions each having separate respective ones of said gate means, said gate means of said first group of adjacent $P^+$ cells and $N^{++}$ emitter regions being operated in antiphase relation with said gate means of said second group of adjacent $P^+$ cells and $N^{++}$ emitter regions.

8. The device of claim 5, further comprising a plurality of adjacent $P^+$ cells disposed at an outer periphery of said chip.

9. An insulated gate thyristor comprising a silicon chip having:

a bottom layer of $P^+$ concentration;

a layer of $N^+$ concentration disposed above said bottom layer;

a $N^-$ layer disposed above said $N^+$ layer;

a plurality of spaced $N^{++}$ cells symmetrically distributed over said $N^-$ layer, said $N^{++}$ cells each comprising a $N^{++}$ emitter region contained within and spaced from an edge of a P-type cellular base region; and a plurality of spaced $P^+$ cells symmetrically distributed over said $N^-$ layer, said $P^+$ cells each comprising a $N^{++}$ source region, spaced from an edge of a P-type base to form a respective channel;

wherein said $N^{++}$ source region is connected to said P-type cellular base region by a metal strap which is at floating potential.

10. The device of claim 9, wherein said $N^{++}$ cells are interspersed in checkerboard fashion with said $P^+$ cells, whereby each of said $N^{++}$ cells is surrounded by ones of said $P^+$ cells.

11. The device of claim 10, further comprising gate means disposed atop the channels of said $P^+$ cells, and atop a space between adjacent $N^{++}$ cells and $P^+$ cells.

12. The device of claim 11, further comprising a cathode contact connected to said $P^+$ cells and said $N^{++}$ emitter regions.

13. The device of claim 12, further comprising an anode contact connected to said bottom $P^+$ layer.

14. The device of claim 10, further comprising a plurality of adjacent $P^+$ cells disposed at an outer periphery of said chip.

* * * * *